United States Patent
Reymann et al.

(10) Patent No.: US 10,352,655 B2
(45) Date of Patent: Jul. 16, 2019

(54) INSTRUMENTED TRAINING MORTAR SYSTEM

(71) Applicant: Cubic Corporation, San Diego, CA (US)

(72) Inventors: Steffen Reymann, Guildford (GB); Gavin Smith, Crawley (GB)

(73) Assignee: Cubic Corporation, San Diego, CA (US)

( * ) Notice: Subject to any disclaimer, the term of this patent is extended or adjusted under 35 U.S.C. 154(b) by 0 days.

(21) Appl. No.: 15/903,558

(22) Filed: Feb. 23, 2018

(65) Prior Publication Data

US 2018/0364006 A1    Dec. 20, 2018

Related U.S. Application Data

(60) Provisional application No. 62/522,197, filed on Jun. 20, 2017.

(51) Int. Cl.
*F42B 8/20* (2006.01)
*F41A 33/00* (2006.01)
(Continued)

(52) U.S. Cl.
CPC .............. *F41G 3/30* (2013.01); *F41A 33/00* (2013.01); *F41G 1/50* (2013.01); *F41G 3/26* (2013.01);
(Continued)

(58) Field of Classification Search
None
See application file for complete search history.

(56) References Cited

U.S. PATENT DOCUMENTS

| | | | | |
|---|---|---|---|---|
| 4,711,180 A | * | 12/1987 | Smolnik | F42B 8/10 102/372 |
| 4,898,097 A | * | 2/1990 | Jordan | F42B 5/38 102/282 |

(Continued)

FOREIGN PATENT DOCUMENTS

| | | |
|---|---|---|
| CN | 201187971 Y | 1/2009 |
| DE | 20-2015-001085 U1 | 5/2016 |
| EP | 0952422 A1 | 10/1999 |

OTHER PUBLICATIONS

Search report dated Aug. 23, 2018 in related United Kingdom application 1803245.8, all pages.
(Continued)

*Primary Examiner* — Eddy Saint-Vil
*Assistant Examiner* — William D Ermlick
(74) *Attorney, Agent, or Firm* — Kilpatrick Townsend & Stockton

(57) ABSTRACT

A weapon training system including a magnetic sensor system is described. The magnetic sensor system is insertable into or integrated with a round of an indirect firing weapon and includes at least one magnetic sensor and a microcontroller communicatively coupled to the at least one magnetic sensor. The microcontroller is configured to perform operations including receiving at least one proximity signal from the at least one magnetic sensor indicating a proximity of at least one magnet of at least one charge to the at least one magnetic sensor, determining, based on the at least one proximity signal, that the at least one charge is removably attached to the round, generating an output signal indicating that the at least one charge is removably attached to the round, and wirelessly transmitting the output signal to an electronic device.

17 Claims, 10 Drawing Sheets

(51) Int. Cl.
  F42B 30/10    (2006.01)
  F42B 30/12    (2006.01)
  G01R 33/07    (2006.01)
  F41G 1/50     (2006.01)
  F41G 3/26     (2006.01)
  F41G 3/30     (2006.01)
  G01S 19/13    (2010.01)

(52) U.S. Cl.
  CPC ............... *F42B 8/20* (2013.01); *F42B 30/10* (2013.01); *F42B 30/12* (2013.01); *G01R 33/072* (2013.01); *G01S 19/13* (2013.01)

(56) References Cited

U.S. PATENT DOCUMENTS

| | | | | | |
|---|---|---|---|---|---|
| 5,228,855 | A * | 7/1993 | Frost | | F42B 30/12 102/373 |
| 5,303,495 | A * | 4/1994 | Harthcock | | F41A 9/62 42/1.02 |
| 5,677,509 | A * | 10/1997 | Potvin | | F42B 8/16 102/445 |
| 6,059,573 | A * | 5/2000 | Patel | | F41G 3/30 434/16 |
| 6,193,517 | B1 * | 2/2001 | Lazecki | | F41A 33/00 434/12 |
| 6,247,411 | B1 * | 6/2001 | Vornfett | | F41A 19/58 102/469 |
| 6,247,412 | B1 * | 6/2001 | Vornfett | | F42B 5/08 102/469 |
| 6,955,125 | B1 * | 10/2005 | Mazzei | | F42B 8/20 102/444 |
| 7,059,251 | B1 * | 6/2006 | Khanna | | F42B 5/38 102/282 |
| 7,690,305 | B2 * | 4/2010 | Harjula | | F42B 30/12 102/288 |
| 9,921,035 | B2 * | 3/2018 | Jandl | | F41G 3/26 |
| 2002/0144447 | A1 * | 10/2002 | Hathaway | | F41A 17/06 42/70.11 |
| 2005/0073302 | A1 * | 4/2005 | Hibbs | | A61B 5/04 324/247 |
| 2005/0252065 | A1 * | 11/2005 | Scherpf | | F41G 1/34 42/123 |
| 2016/0169626 | A1 * | 6/2016 | Christians | | F41A 33/00 434/11 |
| 2016/0238344 | A1 * | 8/2016 | Jandl | | F42B 8/20 |

OTHER PUBLICATIONS

International Search Report and Written Opinion dated Apr. 26, 2018 for PCT/US2018/019884; all pages.

* cited by examiner

INSTRUMENTED TRAINING MORTAR SYSTEM

CROSS-REFERENCES TO RELATED APPLICATIONS

This application is a nonprovisional of and claims the benefit of priority to U.S. Provisional Patent Application No. 62/522,197, filed Jun. 20, 2017, entitled "INSTRUMENTED TRAINING MORTAR SYSTEM," the content of which is herein incorporated in its entirety.

BACKGROUND OF THE INVENTION

At the individual and team levels, indirect fire training (e.g., artillery, mortar, rocket, grenade launcher, machine gun, etc.) is typically performed using either live ammunition, no ammunition (dry training), or by the use of specialized part task trainers. At the collective training level where the use of live ammunition is constrained by safety, there is currently no ability to link the dry drills on the platform/weapon with the instrumented collective training systems being used tactically in the fields. As a result, whilst the indirect fire system can maneuver in support of training, calls for fire are emulated synthetically without the need for any action by artillery detachment, significantly reducing the training value for all participants. Accordingly, new systems, methods, and other techniques are needed for improving indirect fire training.

SUMMARY OF THE INVENTION

Embodiments described herein may include methods, systems, and other techniques for implementing a weapon training system. The weapon training system may include a magnetic sensor system that is insertable into or integrated with a round of an indirect firing weapon. The magnetic sensor system may include at least one magnetic sensor and a microcontroller communicatively coupled to the at least one magnetic sensor. In some embodiments, the microcontroller is configured to perform operations including receiving at least one proximity signal from the at least one magnetic sensor, wherein the at least one proximity signal indicates a proximity of at least one magnet of at least one charge to the at least one magnetic sensor, and wherein the at least one charge is configured to removably attach to the round, determining, based on the at least one proximity signal, that the at least one charge is removably attached to the round, generating an output signal indicating that the at least one charge is removably attached to the round, and wirelessly transmitting the output signal to an electronic device. The weapon training system may also include the at least one charge. The weapon training system may further include the electronic device communicatively coupled to the microcontroller, wherein the electronic device is configured to receive the output signal from the microcontroller, and to determine, based on the output signal, that a simulated firing of the indirect firing weapon is to be performed. The weapon training system may also include the indirect firing weapon including a barrel, wherein the barrel is configured to receive the round such that the round is insertable into the barrel.

In some embodiments, the magnetic sensor system may further include an inertial measurement unit (IMU) configured to generate a movement signal and to send the movement signal to the microcontroller. In some embodiments, the operations may further include receiving the movement signal from the IMU, determining, based on the movement signal, that the round was inserted into the barrel, and modifying the output signal to indicate that the round was inserted into the barrel. In some embodiments, the magnetic sensor system further comprises a substrate having a first side and a second side opposite the first side. In some embodiments, a first magnetic sensor of the at least one magnetic sensor is coupled to the first side of the substrate via a first extender. In some embodiments, a second magnetic sensor of the at least one magnetic sensor is coupled to the second side of the substrate via a second extender. In some embodiments, the first magnetic sensor is coupled to the first side of the substrate via a first extender. In some embodiments, the second magnetic sensor is coupled to the second side of the substrate via a second extender. In some embodiments, the first extender is parallel to the second extender.

In some embodiments, a third magnetic sensor of the at least one magnetic sensor is coupled to the first side of the substrate via a third extender. In some embodiments, a fourth magnetic sensor of the at least one magnetic sensor is coupled to the second side of the substrate via a fourth extender. In some embodiments, the first extender, the second extender, the third extender, and the fourth extender are parallel to each other. In some embodiments, the at least one magnet includes a first magnet and a second magnet. In some embodiments, the at least one charge includes a first charge that includes the first magnet and the second magnet. In some embodiments, the first magnet and the second magnet are positioned within the first charge such that, when the first charge is removably attached to the round, the first magnet and the second magnet form a 90 degree angle with respect to a longitudinal axis of the round. In some embodiments, the weapon training system includes a Global Navigation Satellite System (GNSS) receiver coupled to the indirect firing weapon. In some embodiments, the GNSS receiver may be configured to determine a position of the indirect firing weapon and to wirelessly transit the position to the electronic device. The weapon training system may also include an orientation sensor coupled to the indirect firing weapon, wherein the orientation sensor is configured to determine an orientation of the barrel and to wirelessly transit the orientation to the electronic device.

Embodiments described herein may further include a method for implementing a weapon training system. The method may include receiving at least one proximity signal from at least one magnetic sensor of a magnetic sensor system that is insertable into or integrated with a round of an indirect firing weapon, wherein the at least one proximity signal indicates a proximity of at least one magnet of at least one charge to the at least one magnetic sensor, and wherein the at least one charge is configured to removably attach to the round. The method may also include determining, based on the at least one proximity signal, that the at least one charge is removably attached to the round. The method may further include generating an output signal indicating that the at least one charge is removably attached to the round. In some embodiments, the method may include wirelessly transmitting the output signal to an electronic device. In some embodiments, the magnetic sensor system further comprises an IMU configured to generate a movement signal. In some embodiments, the method may include receiving the movement signal from the IMU, determining, based on the movement signal, that the round was inserted into a barrel of the indirect firing weapon, and modifying the output signal to indicate that the round was inserted into the barrel.

BRIEF DESCRIPTION OF THE DRAWINGS

The accompanying drawings, which are included to provide a further understanding of the invention, are incorporated in and constitute a part of this specification, illustrate embodiments of the invention and together with the detailed description serve to explain the principles of the invention. No attempt is made to show structural details of the invention in more detail than may be necessary for a fundamental understanding of the invention and various ways in which it may be practiced.

Figure 1:
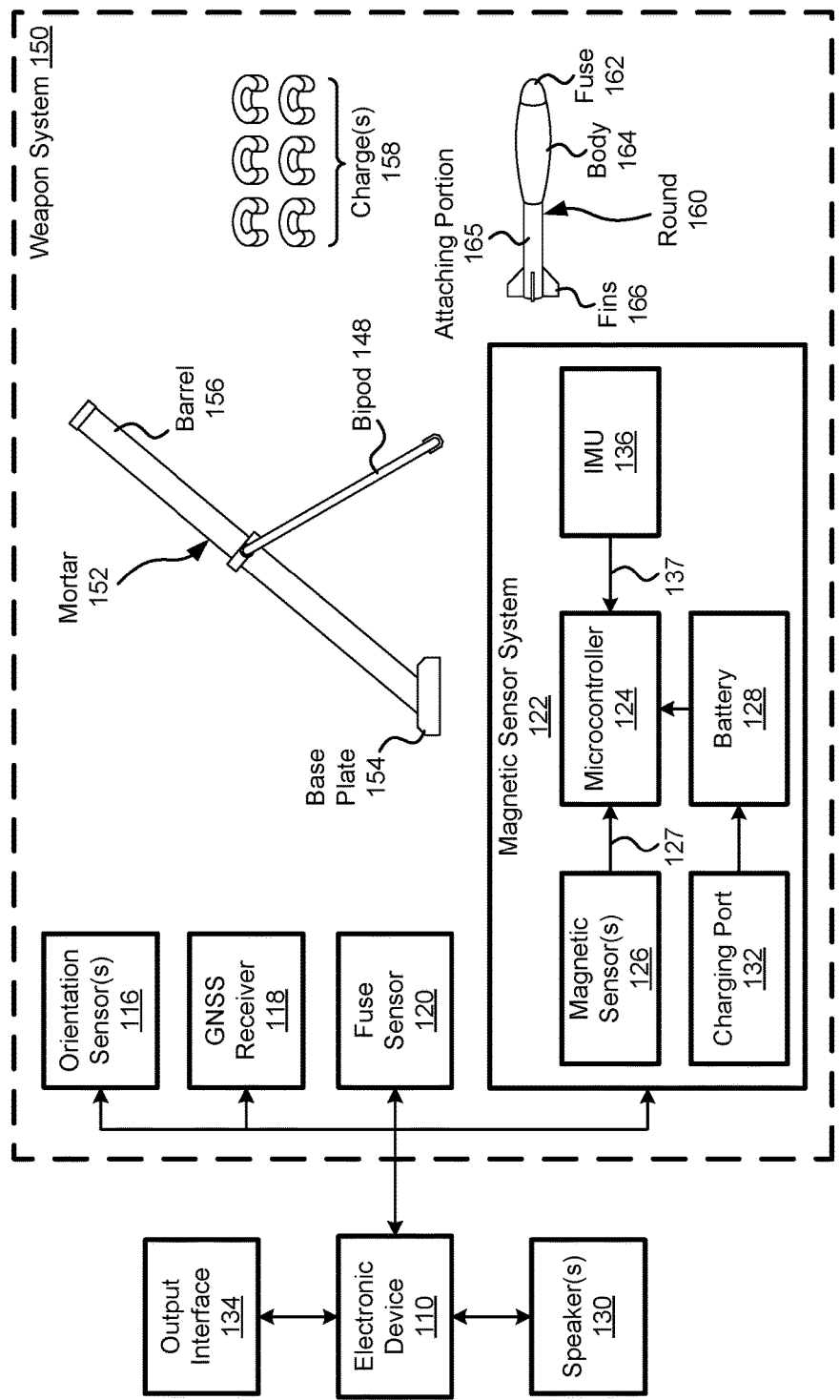
FIG. 1 shows an example of a weapon training system, according to some embodiments of the present disclosure.

In the appended figures, similar components and/or features may have the same numerical reference label. Further, various components of the same type may be distinguished by following the reference label with a letter or by following the reference label with a dash followed by a second numerical reference label that distinguishes among the similar components and/or features. If only the first numerical reference label is used in the specification, the description is applicable to any one of the similar components and/or features having the same first numerical reference label irrespective of the suffix.

DETAILED DESCRIPTION OF THE INVENTION

Embodiments of the present disclosure relate to a weapon training system. The disclosed weapon training system provides an alternative to live fire training and dry fire training, which have significant drawbacks. For example, live fire training is expensive, damaging to the environment, and does not provide a realistic experience for down range infantry, which must remain a significant distance away from any potential firing zones for regulatory and safety reasons. On the other hand, dry fire training does not allow mortar detachments to go through all the actions of a firing protocol, which significantly reduces the training value. Furthermore, dry fire training does not provide a means of determining whether a firing protocol was followed aside from an instructor having to check each individual action visually, at each stage of the firing drills. Dry fire training also does not monitor whether a potential firing zone was properly targeted.

The weapon training system described herein allows detachments to conduct the correct drills on a weapon/platform and for those drills to be captured electronically as part of a wider live, virtual, and constructive (LVC) training system. The data from the weapon training system may be used to train personnel and ensure they are competent and current. The data may also be entered into an existing LVC training domain thereby enabling the integration of the indirect fire platform into the collective training system. In some instances, the data is logged for training review and input into training records for accreditation. Real-time analysis of the weapon training may be presented on an electronic device used by the mortar detachment or by an instructor. The electronic device may indicate whether one or more requirements of a training protocol are being met, and may compare the current weapon training to system wide averages or benchmarks.

The weapon training system described herein allows mortar detachments to use in service equipment to conduct the complete range of drills required for training and to maintain competency and currency. Detachments are able to load ammunition with all elements of the indirect fire system instrumented to capture and record the actions taken to ensure they are correct. For example, detachments are able to load actual or imitation rounds into an actual indirect firing weapon, and for those rounds to remain stacked in the barrel until deliberately unloaded. The evaluator device allows an instructor to monitor visually and/or electronically the actions of the detachment to ensure the correct loading and firing protocols are being followed. Through the same interface, the instructor may insert faults for the detachment to address.

Using Distributive Interactive Simulation (DIS) and/or high-level architecture (HLA), the outputs of the system may enable the drills at the gun position to be interactive with other drills conducted within the wider constructive training system. For example, the gun position may be maneuvered to support friendly forces and to avoid enemy forces. The weapon training system may represent the effects of enemy indirect fire (counter battery) on the position by playing an acoustic cue over the same speakers which are used to represent firing. At the target end, friendly and/or enemy forces may experience the effects of the simulated firing, such as a notification of simulated injury and/or death. The detachment at the gun position may receive communication from down range friendly forces of locations of possible enemy forces, which may be subsequently targeted by modifying a gun bearing, elevation, trunnion tilt, charge type, charge quantity, fuse, and/or ammunition type associated with the indirect firing weapon.

Advantages of the weapon training system described herein include, but are not limited to: retrofit of low-cost and power efficient sensor system(s) into existing training grenades/rounds, a low power sensor system with connectionless wireless transmission which can allow for long operation cycles without need to recharge and/or immediate operation without configuration steps, use of passive training charges which may be cheap to produce with little or no maintenance, collection of all data points that may be needed for straightforward integration of a system into current LVC simulation, full training capability for soldiers without any difference in use to live systems, and the like.

FIG. 1 shows an example of a weapon training system 100, according to some embodiments of the present disclosure. In one implementation, weapon training system 100 allows one or more individuals in a detachment to train using a weapon system 150 which may include a mortar 152, a charge(s) 158, and round 160. Mortar 152 may be any type of indirect firing weapon. Specifically, mortar 152 may be any one of a wide range of weapons that fire a projectile without relying on a direct line of sight between the weapon and the target, including, but not limited to: an artillery, a tank, a rocket, a rocket launcher, a grenade launcher, a heavy machine gun, a naval gun, and the like. Mortar 152 may be an actual weapon capable of firing live rounds or an imitation weapon manufactured for the specific purpose of training, among other possibilities. In one particular implementation, mortar 152 may include a base plate 154 and a bipod 148 for added stability.

Round 160 may be any type of projectile that is propelled toward a target in response to ignition of charge(s) 158. Round 160 may alternatively be referred to as a shell, a mortar bomb, an ammunition, or a grenade, and may, in some embodiments, contain an explosive filling that is ignited down range sometime after (e.g., a few seconds) round 160 is propelled by ignition of charge(s) 158. Round 160 may be compatible with mortar 152 such that round 160 may be muzzle-loaded into mortar 152 by inserting round 160 into an opening at a distal end of a barrel 156 of mortar 152. Accordingly, round 160 may have a diameter equal to or less than an inner diameter of barrel 156. In some embodiments, round 160 is an inexpensive, safe imitation of that described above such that round 160 may have similar size, weight, and/or dimensions of an actual round.

Round 160 may include a fuse 162 that is attached to or integrated with a body 164 of round 160, generally on an opposite end of fins 166. Fuse 162 may be a programmable device capable of igniting round 160 at a specific time based on an elapsed time from being fired from mortar 152 or based on a distance from a target, among other possibilities. For example, fuse 162 may be configured to ignite round 160 when round 160 is approximately 50 feet from reaching a target. As another example, fuse 162 may be configured to ignite round 160 at approximately one second after hitting a target. In some embodiments, fuse 162 is an inexpensive, safe imitation of that described above such that fuse 162 may have similar size, weight, and/or dimensions of an actual fuse.

Charge(s) 158 may include any type of explosive used as a propellant to propel round 160 toward a target. Charge(s) 158 may be a low explosive that deflagrates but does not detonate. Charge(s) 158 may be compatible with round 160 such that charge(s) 158 may be removably attached to an attaching portion 165 of round 160 via any one of various means of attachment such as gripping, adhesive, snap-fit, etc. In some embodiments, charge(s) 158 may include one or more "C-charges" which comprise semi-circular donuts that resemble the letter "C" such that charge(s) 158 may be attached to attaching portion 165 via gripping. Charge(s) 158 may be compatible with mortar 152 such that charge(s) 158 may have an outer diameter equal to or less than an inner diameter of barrel 156. Charge(s) 158 may vary in type (i.e., charge type) and/or may vary in the number of charge(s) 158 (i.e., charge quantity) that are attached to round 160. For example, a first round 160 may require two three-pound charges of type A, a second round 160 may require one three-pound charge of type A, and a third round 160 may require one three-pound charge of type B. In some embodiments, charge(s) 158 are an inexpensive, safe imitation of that described above such that charge(s) 158 may have similar size, weight, and/or dimensions of an actual charge.

Weapon training system 100 may include various components that are communicatively coupled to each other, including but not limited to, an electronic device 110, an orientation sensor(s) 116, a Global Navigation Satellite System (GNSS) receiver 118, a fuse sensor(s) 120, a magnetic sensor system 122, a speaker(s) 130, and an output interface 134. In some embodiments, electronic device 110 behaves as a central receiver and processor of data generated by each of the listed components. In some embodiments, data generated by each of the listed components are transmitted directly to electronic device 110 using one or more communication techniques. In some embodiments, data generated by one or more of the listed components are first communicated via one or more different components prior to being received by electronic device 110. Communication techniques employed by the listed components may include one or more of: Bluetooth®, Bluetooth® Low Energy (LE), Wi-Fi, Institute of Electrical and Electronics Engineers (IEEE) 802.11, Worldwide Interoperability for Microwave Access (WiMAX), Long-Term Evolution (LTE), 3G, 4G, free-space optical communication, optical fiber, wired communication, Universal Serial Bus (USB), and the like.

Electronic device 110 may be configured to receive and process data generated by the various components of FIG. 1. Electronic device 110 may include one or more processors and one or more storage devices. In some embodiments, electronic device 110 may be attached to or integrated with mortar 152 so that it may be easily accessed by individuals of a firing detachment. For example, electronic device 110 may be attached to barrel 156. Alternatively or additionally, electronic device 110 may be a handheld device such as a smart phone or a tablet computer. In some embodiments, electronic device 110 may determine, based on data received from magnetic sensor system 122, that a simulated firing of mortar 152 is to be performed. The determination may be made by analyzing raw data received from magnetic sensor system 122, or by directly receiving an output signal from magnetic sensor system 122 indicating that a simulated firing is to be performed.

Orientation sensor(s) 116 may be communicatively coupled to electronic device 110 and may, in some embodiments, be attached to or integrated with mortar 152. Orientation sensor(s) 116 may include one or more accelerometers and/or one or more gyroscopes for determining an orientation of mortar 152, which may correspond to an orientation of barrel 156. The orientation of mortar 152 may be a three-dimensional value or, in some embodiments, may be a single value corresponding to an angle formed by barrel 156 and the ground, an angle formed by barrel 156 and a predetermined direction (e.g., north), or an elevation of barrel 156. In some embodiments, orientation sensor(s) 116 may monitor the bearing, elevation, and trunnion tilt of a weapon platform. In one implementation, orientation sensor(s) 116 includes a rechargeable power source and communicates data (e.g., the orientation of mortar 152) to electronic device 110 via Bluetooth® LE.

GNSS receiver 118 may be communicatively coupled to electronic device 110 and may, in some embodiments, be attached to or integrated with indirect firing weapon 152. GNSS receiver 118 may be configured to determine a geospatial position of mortar 152, which may correspond to a geospatial position of barrel 156. GNSS receiver 118 may be configured to receive wireless signals transmitted by one or more GNSS satellites, and may perform a trilateration technique to determine a three-dimensional or two-dimensional geospatial position of mortar 152. A three-dimensional geospatial position may comprise X, Y, and Z values or may comprise longitude, latitude, and elevation values, among other possibilities. A two-dimensional geospatial position may comprise X and Y values or may comprise longitude and latitude values, among other possibilities.

Magnetic sensor system 122 may be communicatively coupled to electronic device 110 and may, in some embodiments, be insertable into or integrated with round 160. For example, magnetic sensor system 122 may be inserted into round 160 through a hole created by detaching body 164, fuse 162, and/or a bottom cover positioned near fins 166. When inserted, magnetic sensor system 122 may occupy an interior volume of round 160 corresponding to attaching portion 165 such that charge(s) 158 are aligned at least partially with magnetic sensor system 122 when charge(s) 158 are attached to attaching portion 165. Alternatively, magnetic sensor system 122 may be integrated with round 160 such that round 160 and magnetic sensor system 122 are permanently fixed to each other. In such embodiments, round 160 may be manufactured specifically for weapon training system 100 and may be integrated with magnetic sensor system 122.

Magnetic sensor system 122 may include a microcontroller 124 communicatively coupled to one or more magnetic sensor(s) 126 and an inertial measurement unit (IMU) 136. Magnetic sensor(s) 126 may generate a proximity signal 127 indicating a proximity of a magnet 142 contained in charge(s) 158. Magnetic sensor(s) 126 may send proximity signal 127 to microcontroller 124 upon request from microcontroller 124, at periodic intervals, or continuously by applying a voltage to a wired connection, among other possibilities. In some embodiments, magnetic sensor(s) 126 may comprise Hall effect sensors that generate an output voltage in response to a detected magnetic field. In some embodiments, the output voltage is proportional to a magnitude of the detected magnetic field. IMU 136 may include a combination of one or more accelerometers and/or one or more gyroscopes, and may generate a movement signal 137 indicating a movement of IMU 136. In some instances, IMU 136 may send movement signal 137 to microcontroller 124 upon request from microcontroller 124, at periodic intervals, or continuously by applying a voltage to a wired connection, among other possibilities. Microcontroller 124 may receive power from a battery 128 which may be recharged through a charging port 132. In one particular implementation, battery 128 is a lithium-ion battery.

In response to determining that a simulated firing of mortar 152 is to be performed, electronic device 110 may receive/retrieve/obtain data from orientation sensor(s) 116 and GNSS receiver 118 (either in raw form or processed form), along with data from other sensors. Electronic device 110 may then determine one or more of: a geospatial position of mortar 152, an orientation of mortar 152, a trajectory of a fired round, an area of damage associated with a fired round, and the like. The determined trajectory of the fired round may be based on the geospatial position, the orientation, and the exit velocity of round 160 (which may be determined based on round 160 and charge(s) 158). In some embodiments, the determined trajectory may be calculated using classical mechanics equations and/or lookup tables stored in electronic device 110. For example, the exit velocity may be determined using lookup tables, and the trajectory of the fired round may be determined based on a classical mechanics equation having at least three variables: position, orientation, and exit velocity.

Fuse sensor 122 may be communicatively coupled to firing box 110 and may, in some embodiments, be attached to or integrated with round 160. For example, fuse sensor 122 may be attached to fuse 162, integrated with fuse 162, attached to body 164, or integrated with body 164. Fuse sensor 122 may be encoded with information that identifies a round type (e.g., high explosive, low explosive, smoke, napalm, etc.). In some embodiments, fuse sensor 122 is encoded with information that identifies a fuse setting associated with fuse 162. The fuse setting may be programmed by another device (e.g., electronic device 110) and may include an amount of time after the simulated firing of mortar 152 until a simulated ignition, a distance travelled after the simulated firing of mortar 152 until a simulated ignition, a time from reaching a target, a distance from hitting a target, a time after reaching a target, and the like. In some embodiments, fuse sensor 122 may communicate data indicative of round type and/or the fuse setting to electronic device 110 directly. In other embodiments (or in the same embodiments), fuse sensor 122 may communicate data indicative of round type and/or the fuse setting to microcontroller 124 which may communicate the data to electronic device 110.

Speaker(s) 130 may be communicatively coupled to electronic device 110 and may, in some embodiments, be attached to or integrated with mortar 152. In response to the simulated firing of mortar 152, speaker(s) 130 may be configured to output an audio signal indicative of a weapon firing. The audio signal may be dependent on several factors, including the mortar type, the round type, the charge type, and the charge quantity. In some embodiments, audio files associated with each possible combination of mortar types, round types, charge types, and charge quantities may be stored in electronic device 110 and retrieved when a simulated firing is performed. In some embodiments, speaker(s) 130 may also be configured to output an audio signal indicative of enemy direct and/or indirect fire on the gun position. Furthermore, the audio signal may also include information indicative of a training mission, such as the time remaining or when the training mission has ended.

In some instances, electronic device 110 is used by an instructor to monitor the actions of the firing detachment to ensure correct firing protocols are being followed. In some embodiments, electronic device 110 includes a digital display with a GUI configured to display images and video captured using cameras surrounding mortar 152, as well as an analysis of a training protocol and other statistics. An analysis of a training protocol may include one or more of: an indication that a simulated firing of mortar 152 was performed, an indication that each of one or more requirements of the training protocol were met, an indication that one or more requirements of the training protocol were not met, and the like. In some embodiments, an instructor may introduce faults into a training mission using electronic device 110. For example, an instructor may select an option using a GUI that causes a simulated malfunction of mortar 152. The electronic device 110 may display the requirements that need to be met in order to resolve the weapon malfunction as well as an indication whether each of the requirements have been met. In some embodiments, the instructor may use electronic device 110 to communicate with the firing detachment, who may want to give preliminary instructions prior to the start of a training mission, or give feedback during or after completion of a training mission. For example, audio communications may be received/recorded using electronic device 110 and may be outputted by speaker(s) 130 positioned near the firing detachment. In one implementation, electronic device 110 displays the general state of mortar 152 for the instructor. The general state of mortar 152 may include a geospatial position of the weapon, an orientation of the weapon, a temperature of the weapon, a health of the weapon, a number of rounds fired, a number of targets hit, a number of targets missed, an accuracy of the weapon (e.g., average distance from target to location where round hit), and the like.

In some embodiments, information generated by weapon training system 100 may be outputted to external systems using an output interface 134. In some embodiments, output interface 134 may utilize DIS and/or HLA. Outputs of weapon training system 100 may include one or more of: a trajectory of a fired round, a fuse setting for a fired round, a round type, an area of damage associated with a fired round, an indication that mortar 152 has been destroyed, an indication that the firing detachment associated with mortar 152 has been eliminated, a communication from the firing detachment to down range friendly forces, and the like. Outputs of weapon training system 100 may also include overall results from the training mission, such as mission success, mission failure, the number of objectives completed, and the like. In some embodiments, weapon training system 100 may also receive data from external systems via output interface 134. In one implementation, output interface 134 employs LTE technology.

In some embodiments, multiple weapon training systems 100 may be setup in a side-by-side configuration for training larger numbers of users. In such embodiments, electronic device 110 may differentiate between different weapon systems 150 by analyzing the signal strengths received from different microcontrollers 124 and identifying the largest signal strength. When weapon training system 100 is implemented in a side-by-side configuration, electronic device 110 may be attached directly to mortar 152 such that the corresponding microcontroller 124 may be accurately identified.

Figure 2:
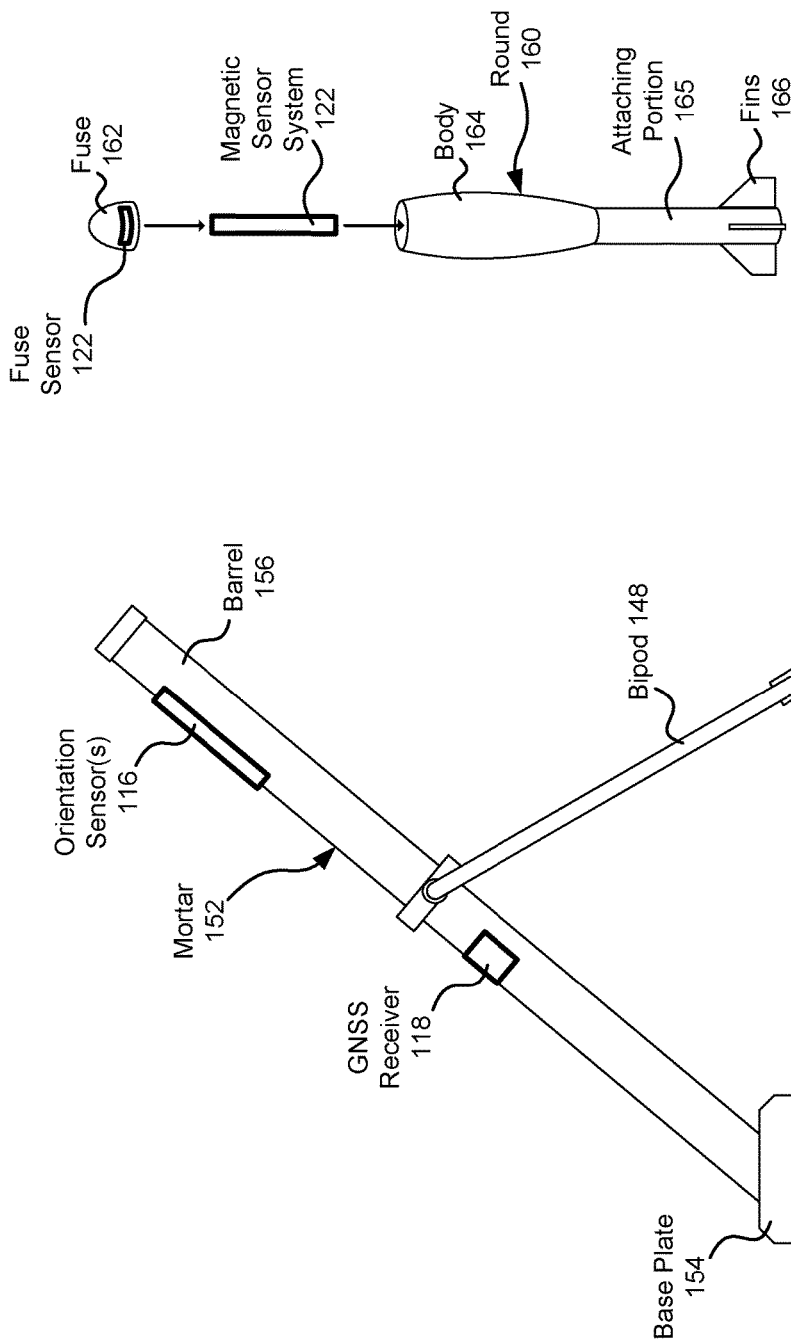
FIG. 2 shows an example of a weapon system having various attached sensors, according to some embodiments of the present disclosure.

FIG. 2 shows an example of weapon system 150 having various attached sensors, according to some embodiments of the present disclosure. In the implementation shown in FIG. 2, orientation sensor(s) 116 is attached to barrel 156 in the longitudinal direction such that a portion of orientation sensor(s) 116 may be aligned with barrel 156, GNSS receiver 118 is attached to barrel 156, fuse sensor 122 is attached to fuse 162, and magnetic sensor system 122 is inserted into round 160 via an opening between fuse 162 and body 164.

Figure 3:
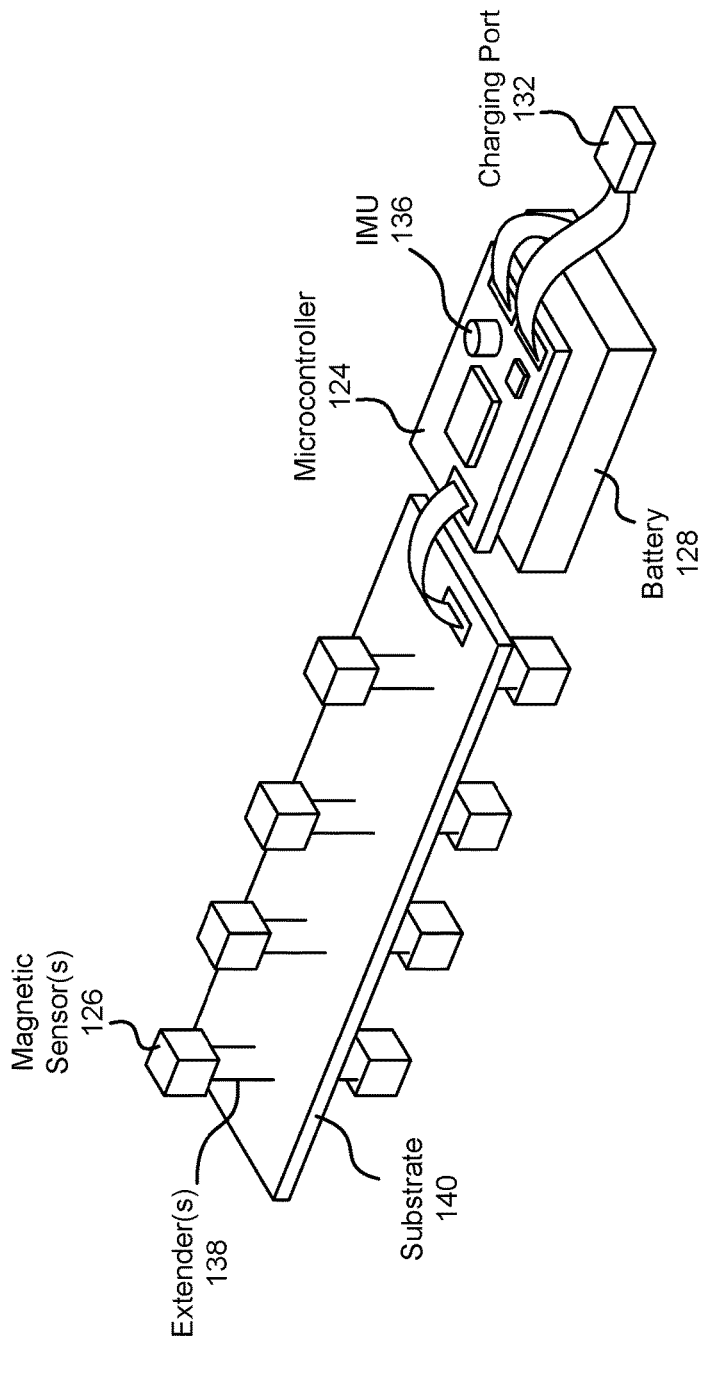
FIG. 3 shows a perspective view of an example of a magnetic sensor system, according to some embodiments of the present disclosure.

FIG. 3 shows a perspective view of an example of magnetic sensor system 122, according to some embodiments of the present disclosure. In the implementation shown in FIG. 3, magnetic sensor system comprises eight magnetic sensors 126 coupled to a substrate 140 via eight extenders 138. In some embodiments, substrate 140 includes a first side and a second side opposite the first side. In the implementation shown in FIG. 3, four of magnetic sensors 126 are coupled to the first side of substrate 140 and four of magnetic sensors 126 are coupled to the second side of substrate 140. Substrate 140 may be substantially planer and may include wired connections for electrically coupling microcontroller 124 to each of extenders 138. Extenders 138 may be rigid rod-like structures that include wired connections for electrically coupling substrate 140 to magnetic sensors 126. In some embodiments, each of extenders 138 are parallel to each other. In some embodiments, a first extender of extenders 138 is colinear with a second extender of extenders 138 such that a first magnetic sensor of magnetic sensors 126 that is coupled to the first extender is opposite to a second magnetic sensor of magnetic sensors 126 that is coupled to the second extender. The first magnetic sensor and the second magnetic sensor may be equidistant to substrate 140 and may be aligned in the longitudinal direction.

In some embodiments, substrate 140 is physically and/or electrically coupled to microcontroller 124 via a ribbon cable comprising multiple electrical conductors. In some embodiments, substrate 140 is coupled to microcontroller 124 via a rigid connection such that substrate 140 and microcontroller 124 are fixed to each other. In some embodiments, IMU 136 is integrated with microcontroller 124, while in other embodiments IMU 136 may be attached to substrate 140 or may occupy a separate chip coupled to microcontroller 124 via a ribbon cable or other wired connection.

Figure 4:
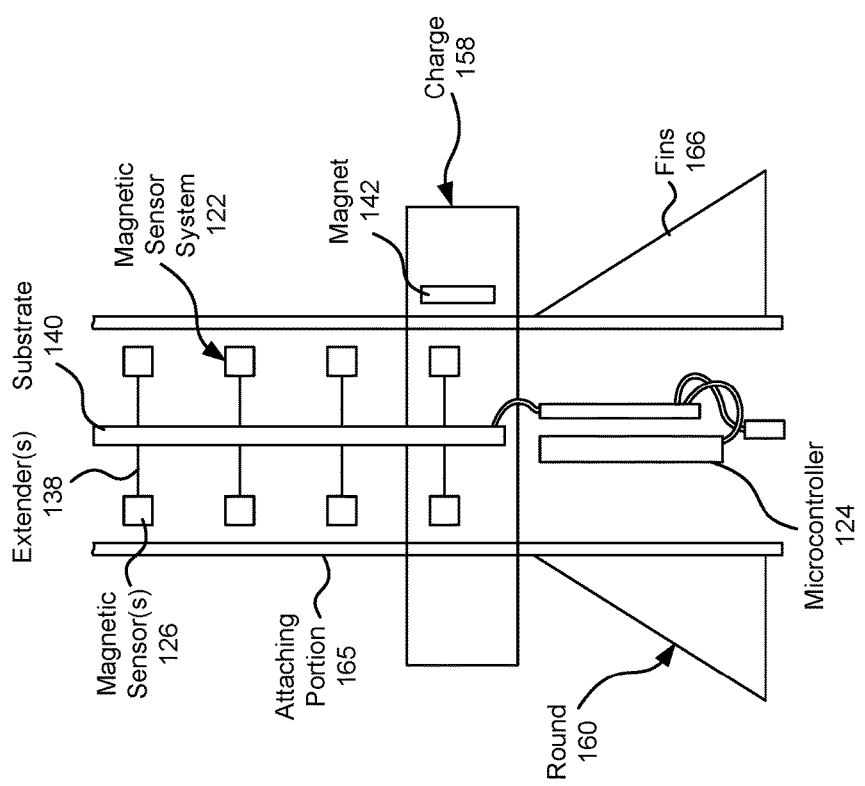
FIG. 4 shows a side view of an example of a weapon system, according to some embodiments of the present disclosure.

FIG. 4 shows a side view of an example of weapon system 150, according to some embodiments of the present disclosure. In the implementation shown in FIG. 4, charge 158 is attached to attaching portion 165 of round 160 such that magnet 142 is aligned in the longitudinal direction with two of magnetic sensor(s) 126. In response to detecting magnet 142, magnetic sensor(s) 126 may generate and send proximity signal 127 to microcontroller 124 indicating a proximity of magnet 142 to magnetic sensor(s) 126. Additionally, proximity signal 127 may indicate that a single charge 158 is attached to round 160. In some embodiments, different magnet(s) 142 may differ in magnetic strength and may indicate a charge type and/or a charge amount corresponding to charge 158. In some embodiments, additional charges 158 may be attached to round 160 such that they are aligned with different magnetic sensor(s) 126 in the longitudinal direction.

Figure 5:
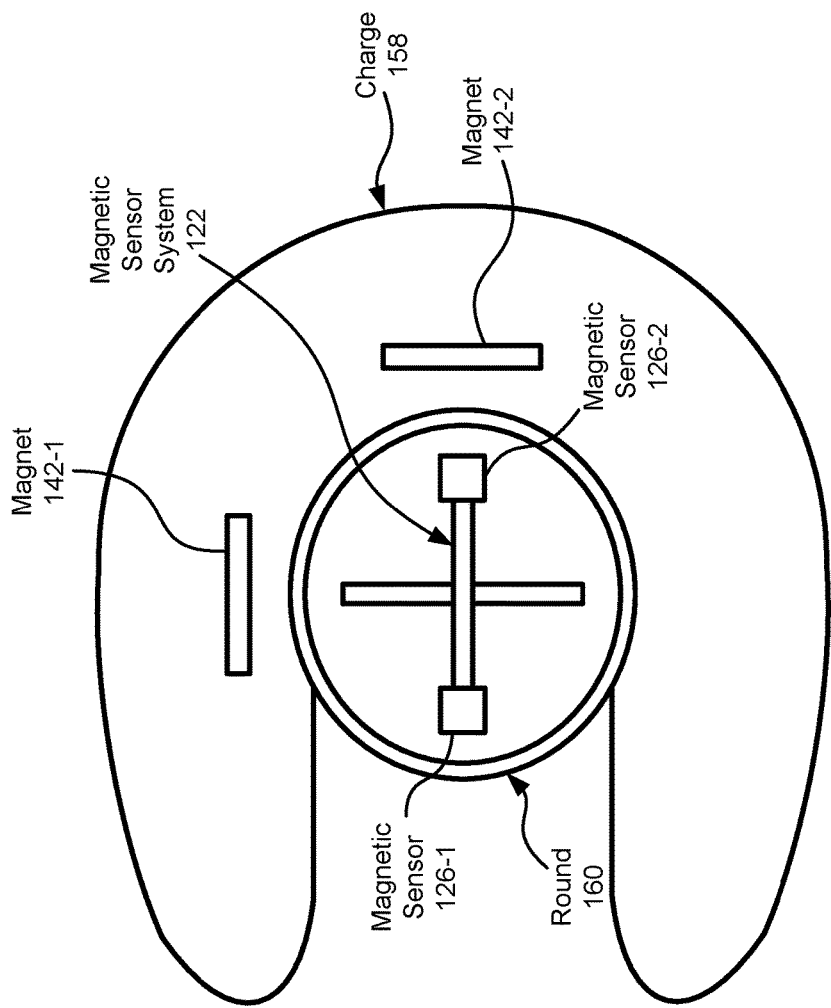
FIG. 5 shows a top view of an example of a weapon system, according to some embodiments of the present disclosure.

FIG. 5 shows a top view of an example of weapon system 150, according to some embodiments of the present disclosure. In the implementation shown in FIG. 5, a first magnet 142-1 and a second magnet 142-2 are positioned within charge 158 such that the two magnets form a 90 degree angle with respect to the longitudinal axis of round 160. In such embodiments, at least one of magnets 142-1 and 142-2 will be at the most 45 degrees from one of magnetic sensors 126-1 and 126-2, allowing charge 158 to contain a fewer amount of magnets 142 while still having enough magnets 142 to be detected by magnetic sensors 126.

Figure 6:
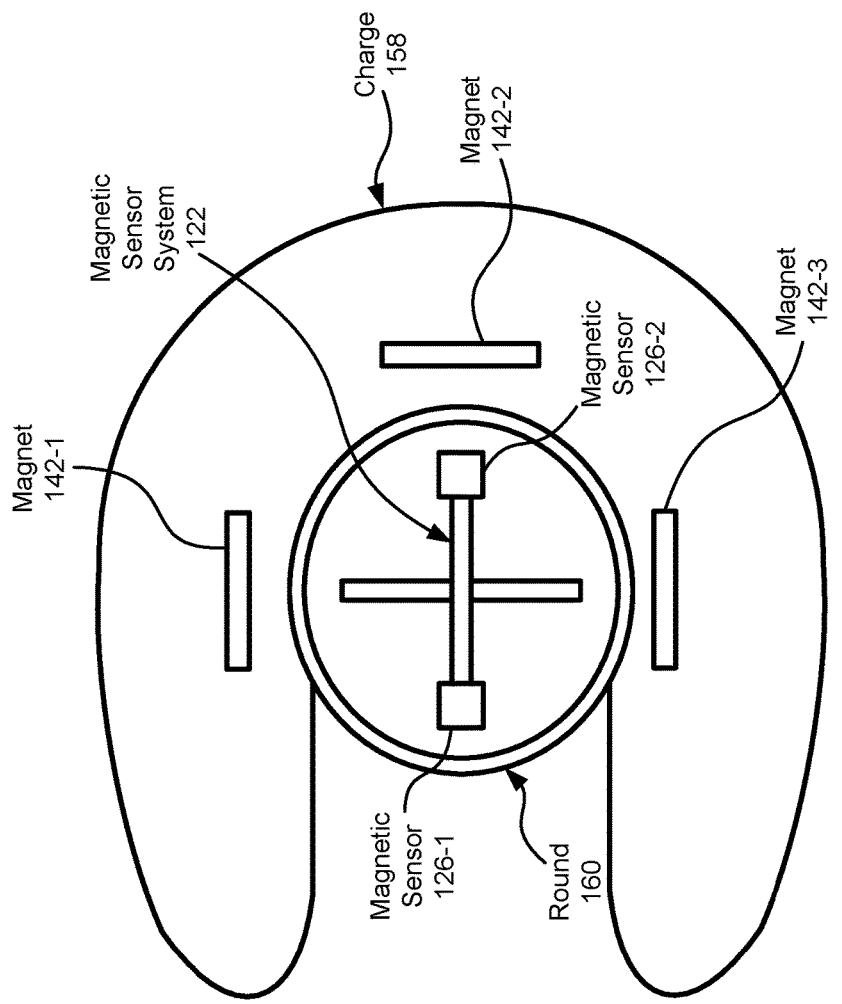
FIG. 6 shows a top view of an example of a weapon system, according to some embodiments of the present disclosure.

FIG. 6 shows a top view of an example of weapon system 150, according to some embodiments of the present disclosure. In the implementation shown in FIG. 6, first magnet 142-1, second magnet 142-2, and a third magnet 142-3 are positioned within charge 158 such that magnets 142-1 and 142-2 form a 90 degree angle with respect to the longitudinal axis of round 160, and such that magnets 142-2 and 142-3 form a 90 degree angle with respect to the longitudinal axis of round 160. By including magnet 142-3, a stronger magnetic signal may be detected compared to the implementation shown in FIG. 5.

Figure 7:
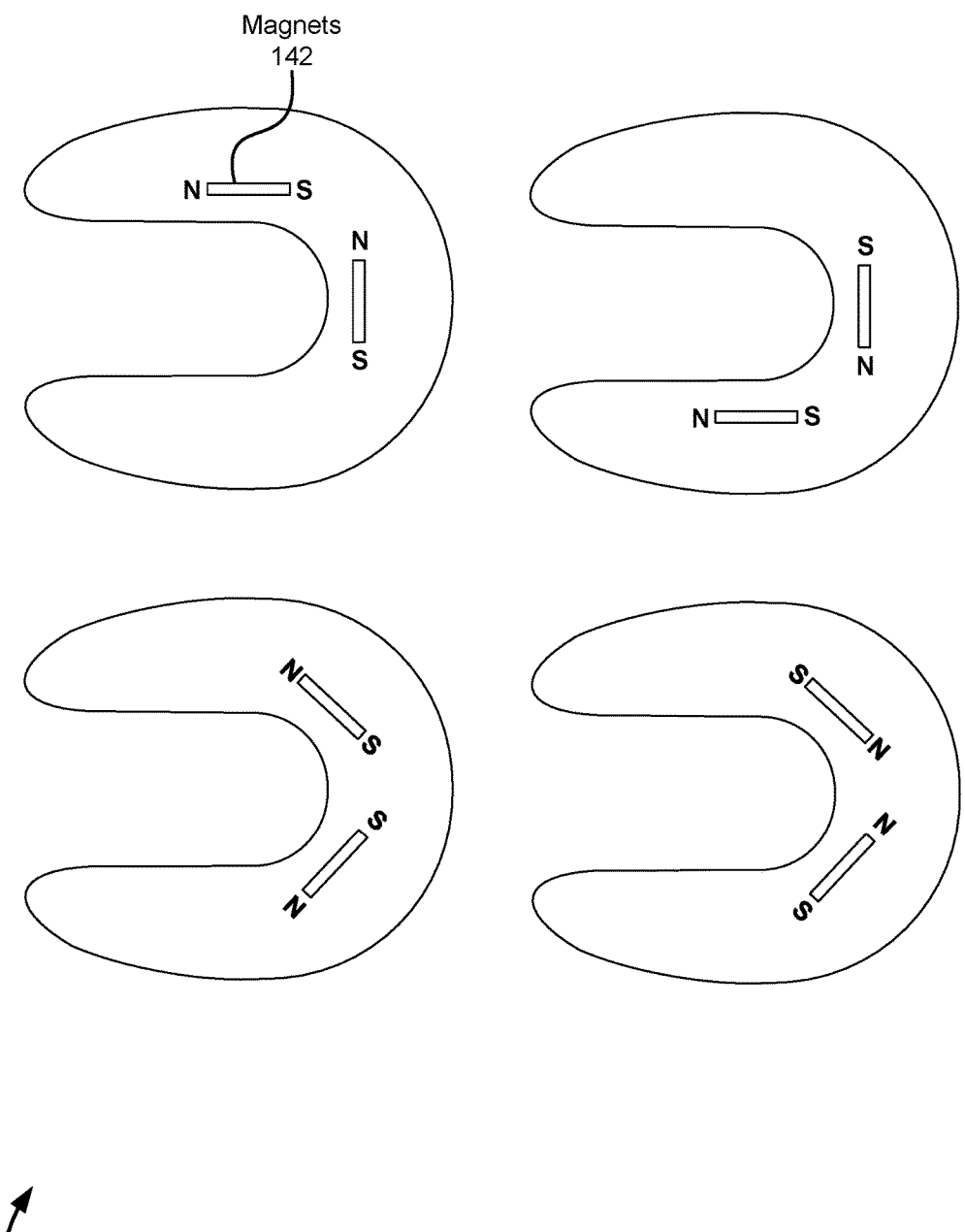
FIG. 7 shows a top view of various configurations of charges, according to some embodiments of the present disclosure.

FIG. 7 shows a top view of various configurations of charges 158, according to some embodiments of the present disclosure. By arranging the polarities of magnets 142 in the transverse direction as shown, charges 158 may stack in the longitudinal direction without significant repulsive forces amongst them.

Figure 8:
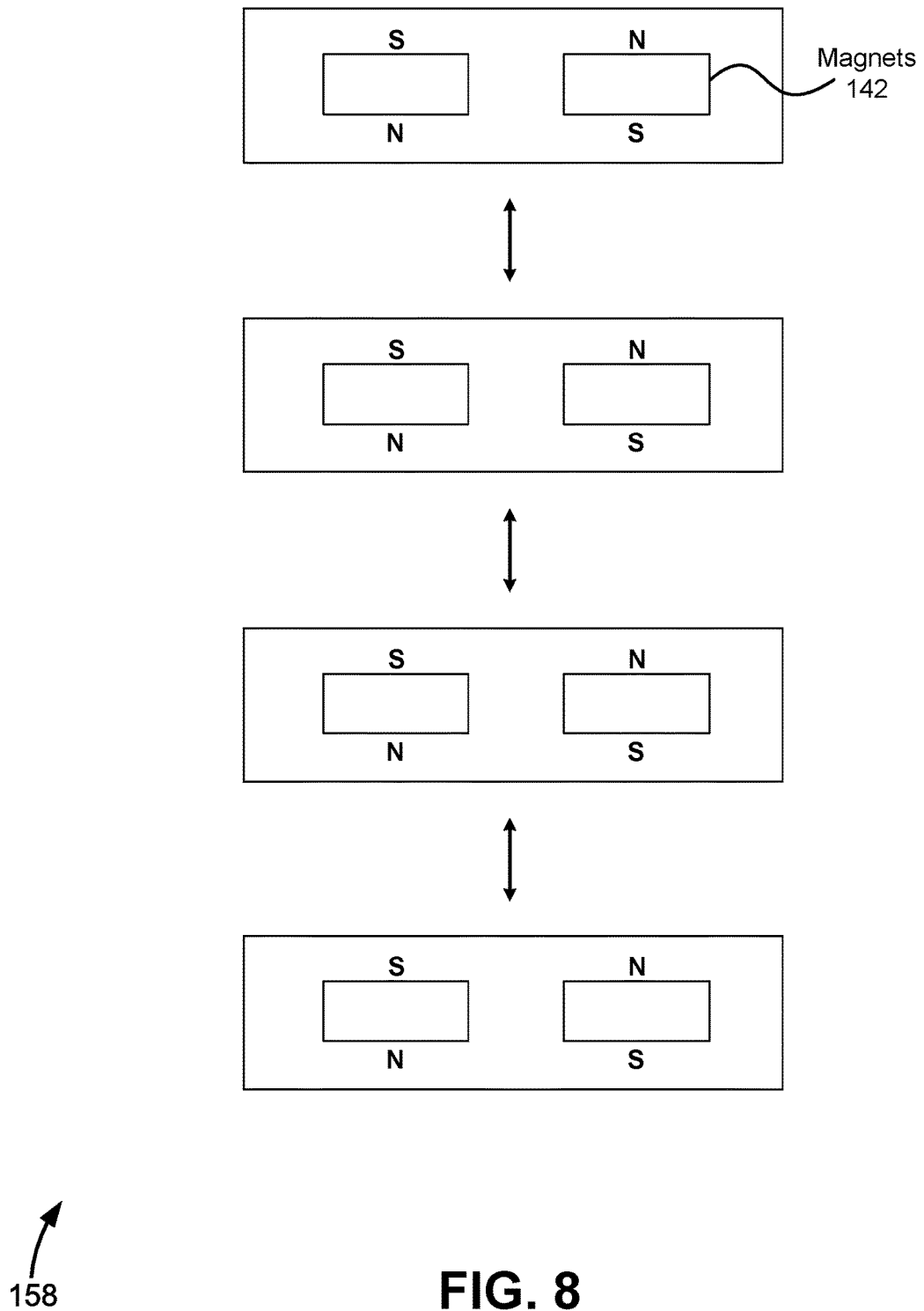
FIG. 8 shows a side view of various configurations of charges, according to some embodiments of the present disclosure.

FIG. 8 shows a side view of various configurations of charge(s) 158, according to some embodiments of the present disclosure. By arranging the polarities of magnets 142 in the longitudinal direction as shown, charges 158 may stack in the longitudinal direction without significant repulsive forces amongst them.

Figure 9:
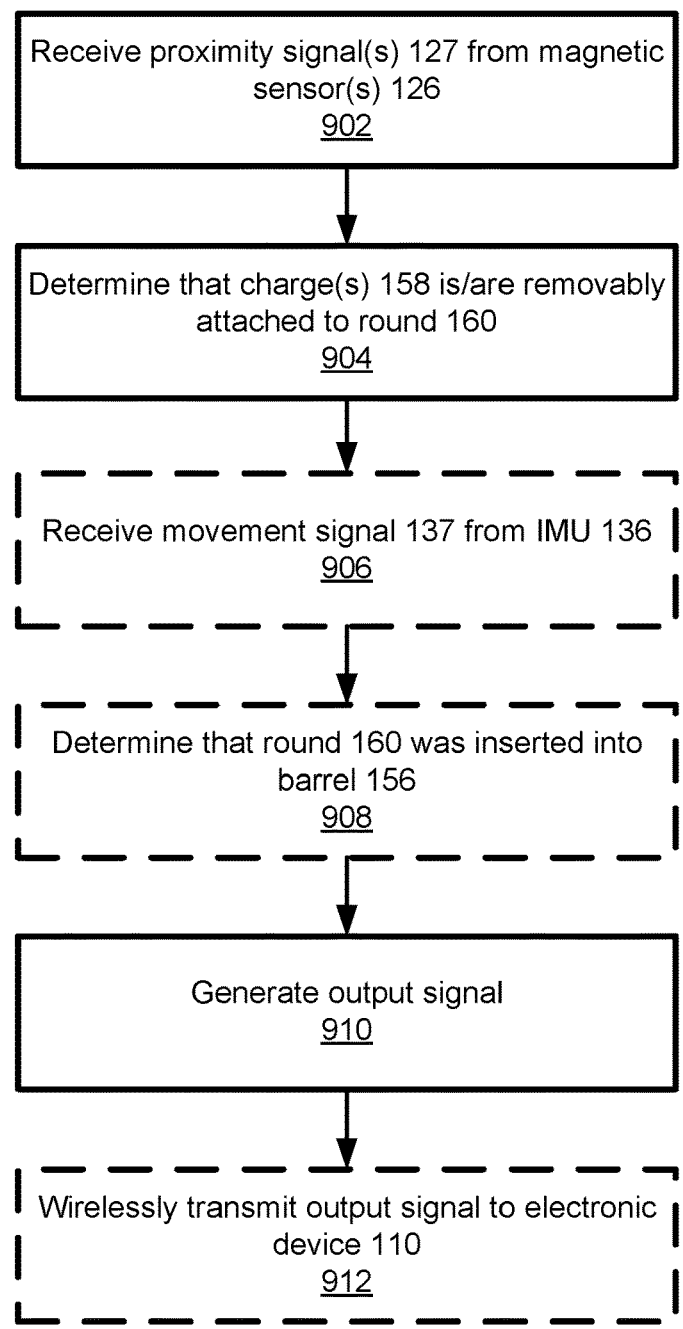
FIG. 9 shows a method for implementing a weapon training system, according to some embodiments of the present disclosure.

FIG. 9 shows a method 900 for implementing weapon training system 100, according to some embodiments of the present disclosure. One or more steps of method 900 may be performed by microcontroller 124. Alternatively or additionally, in some embodiments method 900 may be performed in part or entirely by electronic device 110. Steps of method 900 may be performed in a different order than that shown, and not all steps need be performed. For example, in some embodiments steps 906, 908, and 912 may be optional as indicated by dashed lines.

At step 902, proximity signal 127 is received from magnetic sensor 126. Proximity signal 127 may indicate a proximity of magnet 142 of charge 158 to magnetic sensor 126. For example, proximity signal 127 may be a direct current (DC) or alternating current (AC) voltage having a magnitude proportional to a magnitude of a detected magnetic field. In some embodiments, proximity signal 127 may include modulated information indicating a numerical value corresponding to a magnitude of a detected magnetic field. In some embodiments, proximity signal 127 may be a binary signal (on or off) indicating whether a magnetic field is detected or whether magnet 142 is within a threshold distance of magnetic sensor 126. In some embodiments, multiple proximity signals 127 may be received from multiple magnetic sensors 126. In such embodiments, each proximity signal 127 may convey information independent of other proximity signals 127. For example, a first proximity signal 127 may indicate a proximity of 1 cm to a nearest magnet and a second proximity signal 127 may indicate a proximity of 5 cm to a nearest magnet.

At step 904, it is determined, based on proximity signal 127, that charge 158 is removably attached to round 160. In some embodiments, the proximity indicated by each of proximity signals 127 is compared to a threshold, and it may be determined that charge 158 is attached to round 160 when at least one proximity is less than the threshold. In some embodiments, it is only determined that charge 158 is attached to round 160 when two proximity signals 127 corresponding to two adjacent magnetic sensors 126 (i.e., sensors that are aligned in the longitudinal direction) each indicate proximities that are less than the threshold. In some embodiments, microcontroller 124 uses digital signal processing techniques to approximate locations of magnets 142 to determine how many charges 158 are attached to round 160. In some embodiments, microcontroller 124 may determine, based on proximity signal 127, a charge type and/or a charge quantity associated with charge 158.

At step 906, movement signal 137 is received from IMU 136. Movement signal 137 may include a magnitude of movement and a direction of movement. In some embodiments, IMU 136 may transmit movement signal 137 continuously or periodically to microcontroller 124 such that movement parameters may be tracked as a function of time. In some embodiments, IMU 136 sends movement signal 137 in response to detected movements of IMU 136.

At step 908, it is determined, based on movement signal 137, that round 160 was inserted into barrel 156. For example, it may be determined that round 160 was inserted into barrel 156 when a magnitude of movement is continuous for a period of time (indicating that round 160 is travelling down barrel 156 toward the ground) and is then abruptly stopped (indicating that round 160 has reached the bottom of barrel 156). In one particularly implementation, the period of time for which the magnitude of movement is continuous may be compared to a first threshold and abruptness of the stop (deceleration time) may be compared to a second threshold. When both thresholds are met, it may be determined that round 160 was inserted into barrel 156. In such embodiments, the first threshold must be exceeded and the second threshold must not be exceeded.

At step 910, an output signal is generated. The output signal may indicate one or more of: proximity signal 127, a proximity as indicated by proximity signal 127, whether it was determined that charge 158 is removably attached to round 160, a charge type and/or a charge quantity associated with charge 158, movement signal 137, a movement magnitude and/or a movement direction as indicated by movement signal 137, whether it was determined that round 160 was inserted into barrel 156, and the like. Accordingly, output signal may include raw data and/or processed data.

At step 912, the output signal is wirelessly transmitted to electronic device 110. In some embodiments, electronic device 110 may determine whether a simulated firing of mortar 152 is to be performed upon receiving the output signal from microcontroller 124. For example, electronic device 110 may determine whether charge 158 is removably attached to round 160 and whether round 160 was inserted into barrel 156, and if both are determined to have occurred, electronic device 110 may determine that a simulated firing of mortar 152 to be performed. Electronic device 110 may then retrieve a position of mortar 152 from orientation sensor 118, an orientation of barrel 156 from orientation sensor 116, and a fuse setting from fuse sensor 120 so that the parameters of the simulated firing may be outputted to an external system using output interface 134. Additionally, electronic device 110 may provide haptic and/or audio feedback to the mortar detachment by, for example, causing speakers 130 to output an audio signal indicative of a weapon firing.

In some embodiments, method 900 may be performed multiple times without the need for removing rounds 160 from mortar 152. For example, rounds 160 may be stacked and stored within barrel 156 such that a mortar detachment may insert multiple rounds 160 into barrel 156 during a single training session. After completion of the training session, the mortar detachment may lift barrel 156 to remove the inserted rounds or a tool may be inserted into barrel 156 to remove the rounds. In one particular implementation, eight or more rounds may be inserted into barrel 156 before reaching capacity. In some embodiments, the first threshold and second threshold used in reference to the movement parameters (as determined using movement signal 137) are adjusted as each additional round 160 is used to initiate a simulated firing of mortar 152. For example, the first threshold (compared to length of continuous movement of IMU 136) and the second threshold (compared to the deceleration time of IMU 136) may each be decreased with each additional inserted round 160.

Figure 10:
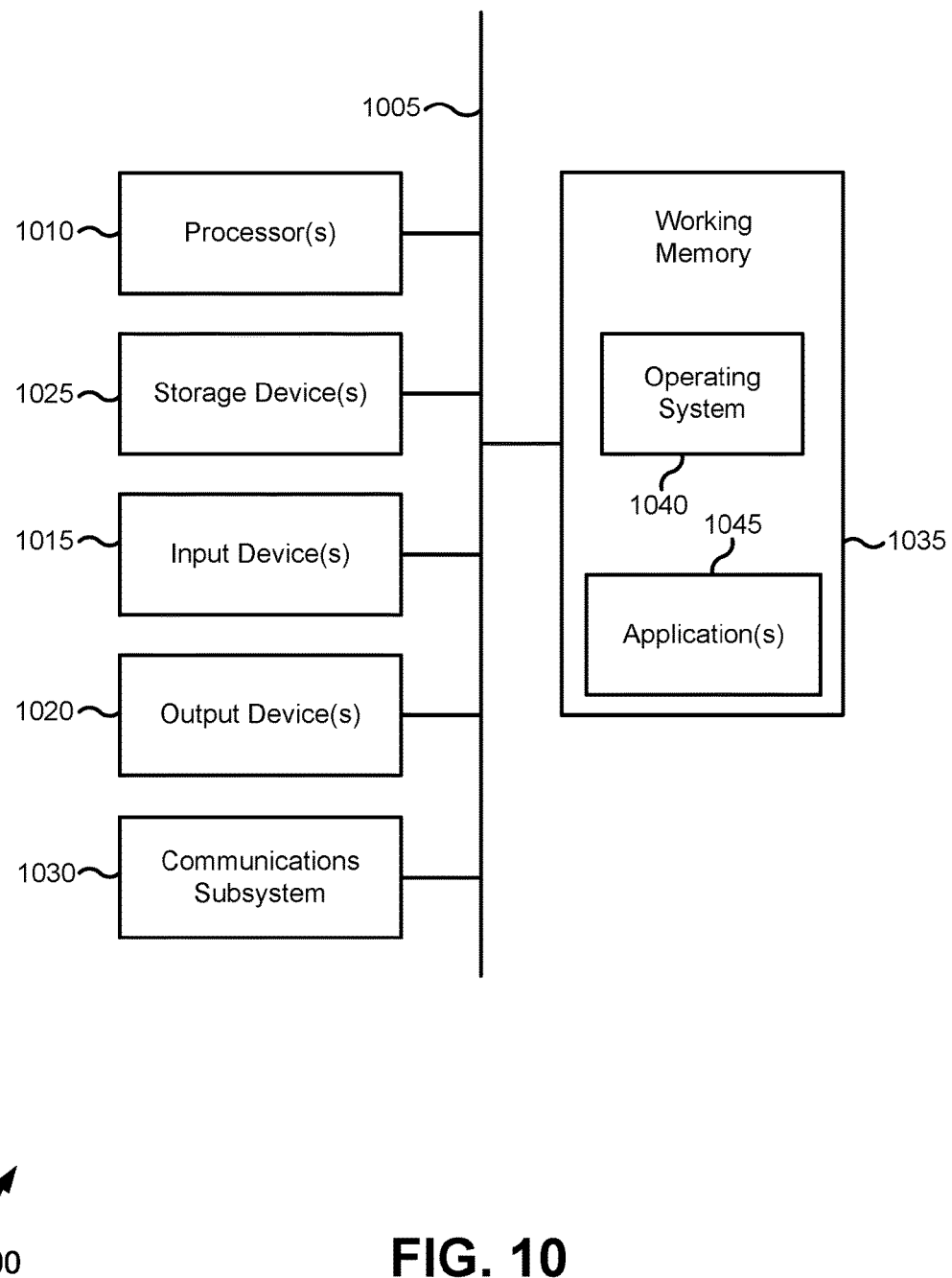
FIG. 10 shows an example of a simplified computer system, according to some embodiments of the present disclosure.

FIG. 10 shows an example of a simplified computer system 1000, according to some embodiments of the present disclosure. A computer system 1000 as illustrated in FIG. 10 may be incorporated into devices such as electronic device 110, microcontroller 124, magnetic sensor(s) 126, IMU 136, orientation sensor(s) 116, GNSS receiver 118, and/or fuse sensor 120. FIG. 10 provides a schematic illustration of one embodiment of a computer system 1000 that can perform some or all of the steps of the methods provided by various embodiments. It should be noted that FIG. 10 is meant only to provide a generalized illustration of various components, any or all of which may be utilized as appropriate. FIG. 10, therefore, broadly illustrates how individual system elements may be implemented in a relatively separated or relatively more integrated manner.

The computer system 1000 is shown comprising hardware elements that can be electrically coupled via a bus 1005, or may otherwise be in communication, as appropriate. The hardware elements may include one or more processors 1010, including without limitation one or more general-purpose processors and/or one or more special-purpose processors such as digital signal processing chips, graphics acceleration processors, and/or the like; one or more input devices 1015, which can include without limitation a mouse, a keyboard, a camera, and/or the like; and one or more output devices 1020, which can include without limitation a display device, a printer, and/or the like.

The computer system 1000 may further include and/or be in communication with one or more non-transitory storage devices 1025, which can comprise, without limitation, local and/or network accessible storage, and/or can include, without limitation, a disk drive, a drive array, an optical storage device, a solid-state storage device, such as a random access memory ("RAM"), and/or a read-only memory ("ROM"), which can be programmable, flash-updateable, and/or the like. Such storage devices may be configured to implement any appropriate data stores, including without limitation, various file systems, database structures, and/or the like.

The computer system 1000 might also include a communications subsystem 1030, which can include without limitation a modem, a network card (wireless or wired), an infrared communication device, a wireless communication device, and/or a chipset such as a Bluetooth® device, an 802.11 device, a Wi-Fi device, a WiMAX™ device, cellular communication facilities, etc., and/or the like. The communications subsystem 1030 may include one or more input and/or output communication interfaces to permit data to be exchanged with a network such as the network described below to name one example, other computer systems, television, and/or any other devices described herein. Depending on the desired functionality and/or other implementation concerns, a portable electronic device or similar device may communicate image and/or other information via the communications subsystem 1030. In other embodiments, a portable electronic device, e.g. the first electronic device, may be incorporated into the computer system 1000, e.g., an electronic device as an input device 1015. In some embodiments, the computer system 1000 will further comprise a working memory 1035, which can include a RAM or ROM device, as described above.

The computer system 1000 also can include software elements, shown as being currently located within the working memory 1035, including an operating system 1040, device drivers, executable libraries, and/or other code, such as one or more application programs 1045, which may comprise computer programs provided by various embodiments, and/or may be designed to implement methods, and/or configure systems, provided by other embodiments, as described herein. Merely by way of example, one or more procedures described with respect to the methods discussed above, such as those described in relation to FIG. 10, might be implemented as code and/or instructions executable by a computer and/or a processor within a computer; in an aspect, then, such code and/or instructions can be used to configure and/or adapt a general purpose computer or other device to perform one or more operations in accordance with the described methods.

A set of these instructions and/or code may be stored on a non-transitory computer-readable storage medium, such as the storage device(s) 1025 described above. In some cases, the storage medium might be incorporated within a computer system, such as computer system 1000. In other embodiments, the storage medium might be separate from a computer system e.g., a removable medium, such as a compact disc, and/or provided in an installation package, such that the storage medium can be used to program, configure, and/or adapt a general purpose computer with the instructions/code stored thereon. These instructions might take the form of executable code, which is executable by the computer system 1000 and/or might take the form of source and/or installable code, which, upon compilation and/or installation on the computer system 1000 e.g., using any of a variety of generally available compilers, installation programs, compression/decompression utilities, etc., then takes the form of executable code.

It will be apparent to those skilled in the art that substantial variations may be made in accordance with specific requirements. For example, customized hardware might also be used, and/or particular elements might be implemented in hardware, software including portable software, such as applets, etc., or both. Further, connection to other computing devices such as network input/output devices may be employed.

As mentioned above, in one aspect, some embodiments may employ a computer system such as the computer system 1000 to perform methods in accordance with various embodiments of the technology. According to a set of embodiments, some or all of the procedures of such methods are performed by the computer system 1000 in response to processor 1010 executing one or more sequences of one or more instructions, which might be incorporated into the operating system 1040 and/or other code, such as an application program 1045, contained in the working memory 1035. Such instructions may be read into the working memory 1035 from another computer-readable medium, such as one or more of the storage device(s) 1025. Merely by way of example, execution of the sequences of instructions contained in the working memory 1035 might cause the processor(s) 1010 to perform one or more procedures of the methods described herein. Additionally or alternatively, portions of the methods described herein may be executed through specialized hardware.

The terms "machine-readable medium" and "computer-readable medium," as used herein, refer to any medium that participates in providing data that causes a machine to operate in a specific fashion. In an embodiment implemented using the computer system 1000, various computer-readable media might be involved in providing instructions/code to processor(s) 1010 for execution and/or might be used to store and/or carry such instructions/code. In many implementations, a computer-readable medium is a physical and/or tangible storage medium. Such a medium may take the form of a non-volatile media or volatile media. Non-volatile media include, for example, optical and/or magnetic disks, such as the storage device(s) 1025. Volatile media include, without limitation, dynamic memory, such as the working memory 1035.

Common forms of physical and/or tangible computer-readable media include, for example, a floppy disk, a flexible disk, hard disk, magnetic tape, or any other magnetic medium, a CD-ROM, any other optical medium, punchcards, papertape, any other physical medium with patterns of holes, a RAM, a PROM, EPROM, a FLASH-EPROM, any other memory chip or cartridge, or any other medium from which a computer can read instructions and/or code.

Various forms of computer-readable media may be involved in carrying one or more sequences of one or more instructions to the processor(s) 1010 for execution. Merely by way of example, the instructions may initially be carried on a magnetic disk and/or optical disc of a remote computer. A remote computer might load the instructions into its dynamic memory and send the instructions as signals over a transmission medium to be received and/or executed by the computer system 1000.

The communications subsystem 1030 and/or components thereof generally will receive signals, and the bus 1005 then might carry the signals and/or the data, instructions, etc. carried by the signals to the working memory 1035, from which the processor(s) 1010 retrieves and executes the instructions. The instructions received by the working memory 1035 may optionally be stored on a non-transitory storage device 1025 either before or after execution by the processor(s) 1010.

The methods, systems, and devices discussed above are examples. Various configurations may omit, substitute, or add various procedures or components as appropriate. For instance, in alternative configurations, the methods may be performed in an order different from that described, and/or various stages may be added, omitted, and/or combined. Also, features described with respect to certain configurations may be combined in various other configurations. Different aspects and elements of the configurations may be combined in a similar manner. Also, technology evolves and, thus, many of the elements are examples and do not limit the scope of the disclosure or claims.

Specific details are given in the description to provide a thorough understanding of exemplary configurations including implementations. However, configurations may be practiced without these specific details. For example, well-known circuits, processes, algorithms, structures, and techniques have been shown without unnecessary detail in order to avoid obscuring the configurations. This description provides example configurations only, and does not limit the scope, applicability, or configurations of the claims. Rather, the preceding description of the configurations will provide those skilled in the art with an enabling description for implementing described techniques. Various changes may be made in the function and arrangement of elements without departing from the spirit or scope of the disclosure.

Also, configurations may be described as a process which is depicted as a schematic flowchart or block diagram. Although each may describe the operations as a sequential process, many of the operations can be performed in parallel or concurrently. In addition, the order of the operations may be rearranged. A process may have additional steps not included in the figure. Furthermore, examples of the methods may be implemented by hardware, software, firmware, middleware, microcode, hardware description languages, or any combination thereof. When implemented in software, firmware, middleware, or microcode, the program code or code segments to perform the necessary tasks may be stored in a non-transitory computer-readable medium such as a storage medium. Processors may perform the described tasks.

Having described several example configurations, various modifications, alternative constructions, and equivalents may be used without departing from the spirit of the disclosure. For example, the above elements may be components of a larger system, wherein other rules may take precedence over or otherwise modify the application of the technology. Also, a number of steps may be undertaken before, during, or after the above elements are considered. Accordingly, the above description does not bind the scope of the claims.

As used herein and in the appended claims, the singular forms "a", "an", and "the" include plural references unless the context clearly dictates otherwise. Thus, for example, reference to "a user" includes a plurality of such users, and reference to "the processor" includes reference to one or more processors and equivalents thereof known to those skilled in the art, and so forth.

Also, the words "comprise", "comprising", "contains", "containing", "include", "including", and "includes", when used in this specification and in the following claims, are intended to specify the presence of stated features, integers, components, or steps, but they do not preclude the presence or addition of one or more other features, integers, components, steps, acts, or groups.

What is claimed is:

1. A weapon training system comprising:
    a magnetic sensor system that is insertable into or integrated with a round of an indirect firing weapon, the magnetic sensor system comprising:
        a substrate having a first side and a second side opposite the first side;
        a plurality of magnetic sensors including a first magnetic sensor coupled to the first side via a first extender and a second magnetic sensor coupled to the second side via a second extender; and
        a microcontroller communicatively coupled to the plurality of magnetic sensors, wherein the microcontroller is configured to perform operations comprising:
            receiving at least one proximity signal from the plurality of magnetic sensors, wherein the at least one proximity signal indicates a proximity of at least one charge to the plurality of magnetic sensors, and wherein the at least one charge is configured to removably attach to the round;
            determining, based on the at least one proximity signal, that the at least one charge is removably attached to the round;
            generating an output signal indicating that the at least one charge is removably attached to the round; and
            wirelessly transmitting the output signal to an electronic device;
    the at least one charge;
    the electronic device communicatively coupled to the microcontroller, wherein the electronic device is configured to receive the output signal from the microcontroller, and to determine, based on the output signal, that a simulated firing of the indirect firing weapon is to be performed; and
    the indirect firing weapon including a barrel, wherein the barrel is configured to receive the round such that the round is insertable into the barrel.

2. The weapon training system of claim 1, wherein the magnetic sensor system further comprises:
    an inertial measurement unit (IMU) configured to generate a movement signal and to send the movement signal to the microcontroller.

3. The weapon training system of claim 2, wherein the operations further comprise:
    receiving the movement signal from the IMU;
    determining, based on the movement signal, that the round was inserted into the barrel; and
    modifying the output signal to indicate that the round was inserted into the barrel.

4. The weapon training system of claim 1, wherein the first extender is parallel to the second extender.

5. The weapon training system of claim 4, wherein:
a third magnetic sensor of the plurality of magnetic sensors is coupled to the first side via a third extender;
a fourth magnetic sensor of the plurality of magnetic sensors is coupled to the second side via a fourth extender; and
the first extender, the second extender, the third extender, and the fourth extender are parallel to each other.

6. The weapon training system of claim 1, wherein:
the at least one charge includes a first charge that includes a first magnet and a second magnet;
the at least one proximity signal indicates the proximity of the first magnet or the second magnet to the plurality of sensors; and
the first magnet and the second magnet are positioned within the first charge such that, when the first charge is removably attached to the round, the first magnet and the second magnet form a 90 degree angle with respect to a longitudinal axis of the round.

7. The weapon training system of claim 1, further comprising:
a Global Navigation Satellite System (GNSS) receiver coupled to the indirect firing weapon, wherein the GNSS receiver is configured to determine a position of the indirect firing weapon and to wirelessly transit the position to the electronic device.

8. The weapon training system of claim 1, further comprising:
an orientation sensor coupled to the indirect firing weapon, wherein the orientation sensor is configured to determine an orientation of the barrel and to wirelessly transit the orientation to the electronic device.

9. A magnetic sensor system that is insertable into or integrated with a round of an indirect firing weapon, the magnetic sensor system comprising:
a substrate having a first side and a second side opposite the first side;
a plurality of magnetic sensors including a first magnetic sensor coupled to the first side via a first extender and a second magnetic sensor coupled to the second side via a second extender; and
a microcontroller communicatively coupled to the plurality of magnetic sensors, wherein the microcontroller is configured to perform operations comprising:
receiving at least one proximity signal from the plurality of magnetic sensors, wherein the at least one proximity signal indicates a proximity of at least one charge to the plurality of magnetic sensors, and wherein the at least one charge is configured to removably attach to the round;
determining, based on the at least one proximity signal, that the at least one charge is removably attached to the round; and
generating an output signal indicating that the at least one charge is removably attached to the round.

10. The magnetic sensor system of claim 9, wherein the operations further comprise:
wirelessly transmitting the output signal to an electronic device.

11. The magnetic sensor system of claim 9, further comprising:
an inertial measurement unit (IMU) configured to generate a movement signal and to send the movement signal to the microcontroller.

12. The magnetic sensor system of claim 11, wherein the operations further comprise:
receiving the movement signal from the IMU;
determining, based on the movement signal, that the round was inserted into a barrel of the indirect firing weapon; and
modifying the output signal to indicate that the round was inserted into the barrel.

13. The magnetic sensor system of claim 9, wherein the first extender is parallel to the second extender.

14. A method for implementing a weapon training system, the method comprising:
receiving at least one proximity signal from a plurality of magnetic sensors of a magnetic sensor system that is insertable into or integrated with a round of an indirect firing weapon, wherein the plurality of magnetic sensors includes a first magnetic sensor coupled to a first side of a substrate via a first extender and a second magnetic sensor coupled to a second side of the substrate opposite the first side via a second extender, wherein the at least one proximity signal indicates a proximity of at least one charge to the plurality of magnetic sensors, and wherein the at least one charge is configured to removably attach to the round;
determining, based on the at least one proximity signal, that the at least one charge is removably attached to the round; and
generating an output signal indicating that the at least one charge is removably attached to the round.

15. The method of claim 14, further comprising:
wirelessly transmitting the output signal to an electronic device.

16. The method of claim 14, wherein the magnetic sensor system further comprises an inertial measurement unit (IMU) configured to generate a movement signal, and wherein the method further comprises:
receiving the movement signal from the IMU;
determining, based on the movement signal, that the round was inserted into a barrel of the indirect firing weapon; and
modifying the output signal to indicate that the round was inserted into the barrel.

17. The method of claim 14, wherein
the first extender is parallel to the second extender.

* * * * *